United States Patent
Kim et al.

(10) Patent No.: US 9,667,202 B2
(45) Date of Patent: May 30, 2017

(54) POWER AMPLIFIER AND METHOD

(71) Applicant: Samsung Electro-Mechanics Co., Ltd., Suwon-Si (KR)

(72) Inventors: Ki Joong Kim, Suwon-Si (KR); Youn Suk Kim, Suwon-Si (KR); Jun Goo Won, Suwon-Si (KR); Sang Wook Park, Suwon-Si (KR); Sung Hwan Park, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/959,418

(22) Filed: Dec. 4, 2015

(65) Prior Publication Data

US 2016/0248387 A1    Aug. 25, 2016

(30) Foreign Application Priority Data

Feb. 24, 2015  (KR) .................. 10-2015-0025698

(51) Int. Cl.
| | |
|---|---|
| *H03F 1/56* | (2006.01) |
| *H03F 3/19* | (2006.01) |
| *H03F 3/21* | (2006.01) |
| *H03F 1/02* | (2006.01) |

(52) U.S. Cl.
CPC .......... *H03F 1/565* (2013.01); *H03F 1/0277* (2013.01); *H03F 3/19* (2013.01); *H03F 3/211* (2013.01); *H03F 2200/387* (2013.01); *H03F 2200/451* (2013.01); *H03F 2203/21106* (2013.01); *H03F 2203/21142* (2013.01)

(58) Field of Classification Search
CPC ..................................... H03F 1/565

USPC ............... 330/251, 51, 302, 124 R, 295
See application file for complete search history.

(56) References Cited

U.S. PATENT DOCUMENTS

| | | | | |
|---|---|---|---|---|
| 5,774,017 | A * | 6/1998 | Adar ................ | H03F 1/0261 330/126 |
| 6,208,203 | B1 * | 3/2001 | Jung ................. | H03F 1/526 330/124 D |
| 6,329,875 | B1 * | 12/2001 | Ishida ............... | H03F 1/0277 330/151 |
| 8,710,927 | B2 * | 4/2014 | Kamitani .......... | H03F 1/0277 330/124 R |
| 2002/0097087 | A1 * | 7/2002 | Petz .................. | H03F 1/526 330/124 R |
| 2006/0006949 | A1 * | 1/2006 | Burns ............... | H03F 3/211 330/301 |
| 2006/0132232 | A1 * | 6/2006 | Baree ............... | H03F 1/0261 330/51 |
| 2010/0327969 | A1 | 12/2010 | Jung et al. | |
| 2011/0187451 | A1 | 8/2011 | Yoon et al. | |

(Continued)

FOREIGN PATENT DOCUMENTS

KR   10-2011-0090295 A   8/2011

*Primary Examiner* — Patricia T Nguyen
(74) *Attorney, Agent, or Firm* — NSIP Law (57) ABSTRACT

A power amplifier may include an amplifying unit configured to amplify an input signal, an impedance varying unit connected between the amplifying unit and an output port that is for outputting an amplified signal of the input signal, and a controller configured to output a first control signal based on a level of power of the amplified input signal of the amplifying unit to control a varying of impedance of the impedance varying unit.

18 Claims, 9 Drawing Sheets

(56) References Cited

U.S. PATENT DOCUMENTS

2013/0027132 A1* 1/2013 Retz ..................... H03F 1/0277
330/192

* cited by examiner

POWER AMPLIFIER AND METHOD

CROSS-REFERENCE TO RELATED APPLICATION

This application claims the priority to, and benefit of, Korean Patent Application No. 10-2015-0025698 filed on Feb. 24, 2015 with the Korean Intellectual Property Office, the disclosure of which is incorporated herein by reference.

BACKGROUND

1. Field

One or more embodiments of the present disclosure relate to a power amplifier and method.

2. Description of Related Art

In general, a power amplifier (PA) amplifying a large signal may consume a relatively large amount of power. The power amplifier may be designed to output power having a specific level in order to improve power efficiency, or the like.

A signal amplified by the power amplifier may then be externally transmitted using an antenna, for example. The level of power of the externally transmitted signal may be dependent on the antenna's efficiency. In a case in which antenna efficiency is degraded, it may be desirable for the power amplifier to output such a signal with a higher level of power to compensate for the antenna's deficiencies, e.g., so that the externally transmitted signal may satisfy requirements of a corresponding communications standard, for example.

In order for the power amplifier to output signals having various levels of power with high efficiency, a plurality of power amplifiers respectively designed with regard to different levels of a plurality of output signals may be required. However, with this technique, a problem in which both unit costs and a size of the power amplifier are increased may occur.

SUMMARY

One or more embodiments provide a power amplifier including an amplifying unit configured to amplify an input signal, an impedance varying unit connected between the amplifying unit and an output port that is for outputting an amplified signal of the input signal, and a controller configured to output a first control signal based on a level of power of the amplified input signal of the amplifying unit to control a varying of impedance of the impedance varying unit.

The controller may output a second control signal to control the level of power, between plural available power levels, of the amplified input signal.

The amplifying unit may include a plurality of amplifying transistors connected to each other in parallel to amplify the input signal, and a first switching unit connected between at least one of the plurality of amplifying transistors and the impedance varying unit to change a configuration of the plurality of amplifying transistors with respect to the impedance varying unit, to control the level of power of the amplified input signal, according to the first control signal.

The plurality of amplifying transistors may include four amplifying transistors that are connected to each other in parallel, the first switching unit may be connected between one amplifying transistor of the four amplifying transistors and the impedance varying unit and selectively operate to disconnect the one amplifying transistor from the impedance varying unit, to control the level of power of the amplified input signal, according to the first control signal, and the impedance varying unit may control impedance of the impedance varying unit, based on the first switching unit, to selectively be a first impedance and a second impedance, wherein the second impedance is two to four times the impedance of the first impedance.

The impedance varying unit may control the impedance of the impedance varying unit to be the second impedance in an off state and to be the first impedance in an on state.

The impedance varying unit may include a plurality of inductors connected to each other in series, and a first impedance switching unit may be connected in parallel with at least one of the plurality of inductors and may selectively, according to the first control signal, connect the at least one inductor with another inductor of the plurality of inductors.

The impedance varying unit may include a plurality of capacitors connected to each other in parallel, and a second impedance switching unit connected between at least two of the plurality of capacitors and may selectively, according to first the control signal, connect the two capacitors.

The impedance varying unit may include a first impedance network having a set impedance, a second impedance network having a variable impedance whose impedance changes based on the first control signal, and the controller may be configured to, as the level of power of the amplified input signal increases, control the first control signal so to implement a decrease in impedance of the second impedance network.

The controller may be configured to, when the level of power of the amplified input signal decreases by 4 dB, control the first control signal so as to implement an increase in a total impedance of the impedance varying unit by two to four times.

One or more embodiments provide a power amplifier including an amplifying unit configured to amplify an input signal, a plurality of impedance networks, having preset respective impedances, selectively connected between the amplifying unit and an output port that is for outputting an amplified signal of the input signal, an impedance switch connected to at least one of the plurality of impedance networks to change at least between a first positive number of the plurality of impedance networks and a second positive number of the plurality of impedance networks being selected to be connected between the amplifying unit and the output port, and a controller configured to output a first control signal based on a level of power of the amplified input signal of the amplifying unit to control switching of the impedance switch.

The amplifying unit may include a plurality of amplifying transistors connected to each other in parallel to amplify the input signal, and a first switching unit connected between at least one of the plurality of amplifying transistors and at least one of the plurality of impedance networks to disconnect the one amplifying transistor from the at least one impedance network, to control the level of power of the amplified input signal, according to the first control signal.

Each of the plurality of impedance networks may include an inductor and a capacitor, and the impedance switch may include a first impedance switching unit connected in parallel with at least one of a plurality of inductors included in the plurality of impedance networks and to selectively, according to the first control signal, connect the at least one inductor with another inductor of the plurality of inductors, and a second impedance switching unit connected between at least two of a plurality of capacitors included in the plurality of impedance networks and to selectively, according to the first control signal, connect the two capacitors.

When the level of power of the amplified input signal output by the amplifying unit meets or is set to meet a preset level of power, the first impedance switching unit may be controlled to disconnect the at least one inductor with the other inductor, and the second impedance switching unit may be controlled to connect the two capacitors when the level of power of the amplified input signal meets the preset level of power.

The power amplifier may further include a biasing unit configured to bias the amplifying unit, wherein the biasing unit may be controlled to provide, to the amplifying unit, a biasing voltage or current determined based on the first control signal.

One or more embodiments provide a power amplifying method, the method including amplifying, through an amplifier configuration having a plurality of amplifying transistors, an input signal based on an impedance seen by the amplifier configuration, varying the impedance seen by amplifier configuration based on a level of power of the amplified input signal, wherein the amplifying includes controlling a connected configuration of the plurality of amplifying transistors in concert with the varying of the impedance seen by the amplifier configuration.

The plurality of amplifying transistors may be arranged in parallel and the amplifying may further include amplifying the input signal in at least a first connected configuration where the plurality of amplifying transistors are connected in parallel when amplifying the input signal and a second connected configuration where less than all of the plurality of amplifying transistors are connected in parallel when amplifying the input signal.

The varying of the impedance may include increasing at least one of an inductor produced inductance and a capacitor produced capacitance, based on whether the level of power of the signal output by the amplifying unit meets a preset level of power.

The method may further include generating a control signal to control the varying of the impedance, including controlling the control signal so to implement a decrease in the impedance as the level of power of the amplified input signal increases.

The method may further generating a control signal to control the varying of the impedance, including controlling the first control signal so as to implement an increase in the impedance by two to four times when the level of power of the amplified input signal decreases by 4 dB.

Other features and/or aspects will be apparent from the following detailed description, the drawings, and the claims.

BRIEF DESCRIPTION OF DRAWINGS

The above and/or other aspects, features and/or advantages of the present disclosure will be more clearly understood from the following detailed description taken in conjunction with the accompanying drawings, in which.

DETAILED DESCRIPTION

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that may be well known to one of ordinary skill in the art may be omitted for increased clarity and conciseness.

The features described herein may be embodied in different forms, and are not to be construed as being limited to the examples described herein.

Various alterations and modifications may be made to the described embodiments, some of which will be illustrated in detail in the drawings and detailed description. However, it should be understood that these embodiments are not construed as limited to the illustrated forms and include all changes, equivalents, or alternatives within the idea and the technical scope of this disclosure.

Terms used herein are to merely explain specific embodiments, and thus are not meant to be limiting. A singular expression includes a plural expression except when two expressions are contextually different from each other. For example, as used herein, the singular forms "a," "an" and "the" are intended to include the plural forms as well, unless the context clearly indicates otherwise. The use of any and all examples, or exemplary language (e.g., "such as") provided herein, is intended merely to better illuminate the underlying concept and does not pose a limitation on the scope of the disclosure. Herein, the terms "include" or "have" are also intended to indicate that characteristics, figures, operations, components, or elements disclosed on the specification or combinations thereof exist. The term "include" or "have" should be understood so as not to pre-exclude the existence of one or more other characteristics, figures, operations, components, elements or combinations thereof or additional possibilities. In addition, terms including ordinal numbers such as 'first', 'second', etc., are used for convenience of description to describe or differentiate between various elements but the elements should not be defined by these terms, and unless contextually having a different meaning are not intended to represent a required sequence or ordering.

Unless otherwise defined, all terms including technical and scientific terms used herein have the same meaning as commonly understood by one of ordinary skill in the art to which this invention belongs, in view of the present disclosure. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Hereinafter, certain embodiments will be explained in more detail with reference to the attached drawings, wherein like reference numerals refer to like elements throughout. Like or the same component or components corresponding to each other will be provided with the same reference numeral, and their detailed explanation will be omitted. When it is determined that a detailed description of a related or known function or configuration may make a purpose of an embodiment of the present disclosure unnecessarily ambiguous or verbose, such a detailed description may be omitted.

Figure 1:
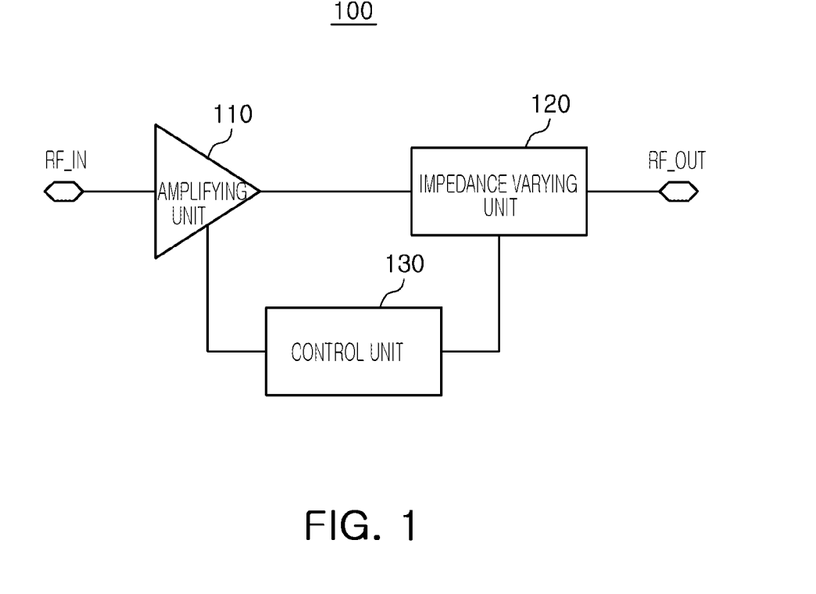
FIG. 1 illustrates a power amplifier, according to one or more embodiments.

FIG. 1 illustrates a power amplifier, according to one or more embodiments.

Referring to FIG. 1, the power amplifier 100 may include an amplifying unit 110, an impedance varying unit 120, and a control unit 130, for example.

The amplifying unit 110 may amplify an input signal. Here, the input signal may be input through an input port RF_IN, for example. In an embodiment, the input signal may be an RF signal. The signal amplified by the amplifying unit 110 may be output through an output port RF_OUT. For example, in an embodiment, the output port RF_OUT may be connected to an antenna of the electronic device embodiment that includes the power amplifier 100.

For example, in a case in which efficiency of the example antenna is determined to be degraded, the amplifying unit 110 may output a signal having a level of power greater than that of a signal used in a case in which the efficiency of the antenna is determined to not be degraded. As an example, if the power output by the amplifying unit 110 is varied and impedance of the impedance varying unit 120 is not varied, efficiency of the power amplifier 100 may be decreased.

The impedance varying unit 120 may be connected between the amplifying unit 110 and the output port RF_OUT so that the impedance thereof may be varied. For example, in an embodiment, the power output by the amplifying unit 110 and output impedance of the amplifying unit 110 may correspond to each other on a one-to-one basis.

Thus, the power amplifying unit 100 may output signals, through output port RF_OUT, having various levels of power in an optimal state. For example, in an embodiment the available various levels of power in the corresponding optimal state or states may be dependent on a communications standard, e.g., dependent on the various levels of power denoted in such a communications standard for varying communication applications consistent with the communications standard.

The control unit 130 may output a control signal based on the level of power of the signal output by the amplifying unit 110 to control the impedance of the impedance varying unit 120.

For example, in a case in which the level of power of the signal output by the amplifying unit 110 fails to meet, or is less than (as only an example), a preset level of power, the control unit 130 may control the impedance varying unit 120 so that the impedance of the impedance varying unit 120 is higher than a predetermined impedance, for example. Likewise, in a case in which the level of power of the signal output by the amplifying unit 110 meets, or is greater than (as only an example), the preset level of power, the control unit 130 may control the impedance varying unit 120 so that the impedance of the impedance varying unit 120 is lower than the predetermined impedance, for example. The level of power of the signal output by the amplifying unit 110 may be determined and/or the control unit 130 may control the impedance varying unit 120 based on a setting of the level of power of the signal output by the amplifying unit 110, to meet or not meet the example preset level of power, e.g., based on a desired high or low power mode. In an embodiment the control unit 130 may implement such determinations and/or such settings, as only an example.

Figure 2:
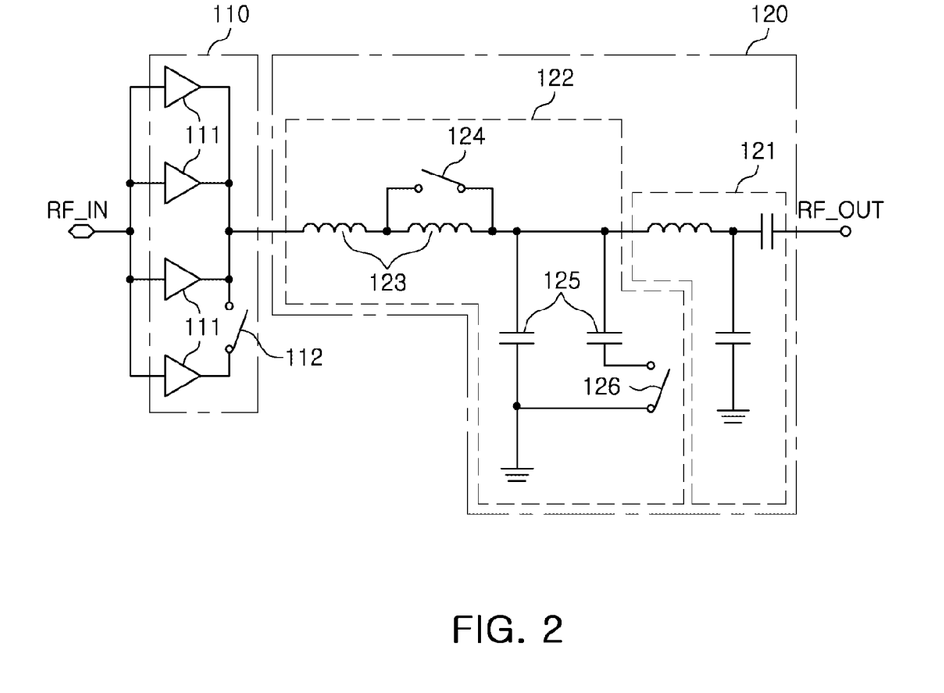
FIG. 2 illustrates a circuit diagram of a power amplifier, according to one or more embodiments.

FIG. 2 illustrates a circuit diagram of a power amplifier, such as the power amplifier 110 of FIG. 1, according to one or more embodiments. Here, though FIG. 2 will be described with reference to the power amplifier of FIG. 1, embodiments are not limited thereto.

Referring to FIG. 2, the amplifying unit 110 may include a plurality of amplifying transistors 111 and a first switching unit 112, for example.

The plurality of amplifying transistors 111 may be connected to each other in parallel to amplify the input signal. Each of the plurality of amplifying transistors 111 may have limited performance in aspects of a maximum gain, a breakdown voltage, linearity, and the like. Therefore, in an embodiment, the plurality of amplifying transistors 111 may be connected to each other in parallel, thereby efficiently amplifying the input signal.

The plurality of amplifying transistors, for example, four amplifying transistors, may be connected to each other in parallel.

The first switching unit 112 may be connected between at least one of the plurality of amplifying transistors 111 and the impedance varying unit 120 to be turned on or off according to a control signal. Here, in an embodiment, the control signal may be the same as the control signal controlling the impedance varying unit 120. For example, in an embodiment, the varying of the impedance may be considered as being controlled in concert with a control of a power level of the amplified signal from the amplifying unit 110.

For example, in a case in which the plurality of amplifying transistors 111 includes four amplifying transistors, the first switching unit 112 may be connected to one to four amplifying transistors. Here, in a case in which the first switching unit 112 is in an off state, the level of power of the signal output by the amplifying unit 110 may be the sum of levels of power of signals output by the amplifying transistors which are not connected to the first switching unit 112 in series. Rather, continuing this example, in the alternate case in which the first switching unit 112 is in an on state, the level of power of the signal output by the amplifying unit 110 may be the sum of levels of power of signals output by all of the plurality of amplifying transistors 111. Specifically, as only an example, the levels of power of signals output by three amplifying transistors may be 19 dBm, and the levels of power of signals output by the four amplifying transistors may be 23 dBm.

For example, the first switching unit 112 may be connected between one of the plurality of amplifying transistors 111 and the impedance varying unit 120. Again, in an embodiment, if the plurality of amplifying transistors 111 includes the example four amplifying transistors, three of the amplifying transistors may not be connected to the first switching unit 112 in series, or said another way, as only an example only at least one of the amplifying transistors may be connected to the first switching unit 112.

In an example, with this example configuration, an impedance of the impedance varying unit 120 may be controlled to be, when the first switching unit 112 is in the off state, equal to two to four times, e.g., about two to four times, that of the impedance varying unit 120 when the first switching unit 112 is in the on state. Specifically, in an embodiment and only as an example, the impedance of the impedance varying unit 120 may be 12Ω when the first switching unit 112 is in the off state and the impedance of the impedance varying unit 120 may be 4Ω when the first switching unit 112 is in the on state.

Referring to FIG. 2, the impedance varying unit 120 may include a first impedance network 121 and a second impedance network 122, for example.

In an embodiment, the first impedance network 121 may have preset impedance. Here, for example, the first impedance network 121 may serve as reference impedance of the impedance varying unit 120. As a result, impedance matching of the power amplifier 100 may be easily performed.

Here, as an example, the second impedance network 122 may have impedance varied based on a control signal. For example, in an embodiment, when the level of power of the signal output by the amplifying unit 110 is high, the second impedance network 122 may be controlled to have low impedance.

For example, the second impedance network 122 may include a plurality of inductors 123, connected to each other in series, a second switching unit 124, a plurality of capacitors 125, connected to each other in parallel, and a third switching unit 125.

The second switching unit 124 may be connected in parallel to at least one of the plurality of inductors 123 to be turned on or off according to a control signal, e.g., the same (or similarly controlled on) control signal that controls the first switching unit 112 and the control signal discussed above (regarding FIG. 1) that controls the impedance varying unit 120. For example, in a case in which the second switching unit 124 is in an off state, inductance of the plurality of inductors 123 may be the sum of levels of inductance of the plurality of inductors 123.

The third switching unit 126 may be connected between at least two of the plurality of inductors 125 to be turned-on or off according to a control signal. For example, in a case in which the third switching unit 126 is in an on state, capacitance of the plurality of capacitors 125 may be the sum of levels of capacitance of the plurality of capacitors 125. Here, the control signal that controls the third switching unit 126 may be the same (or similarly controlled) as the control signal controlling the second switching unit 124 and/or the control signal discussed above (regarding FIG. 1) that controls the impedance varying unit 120.

Figure 3:
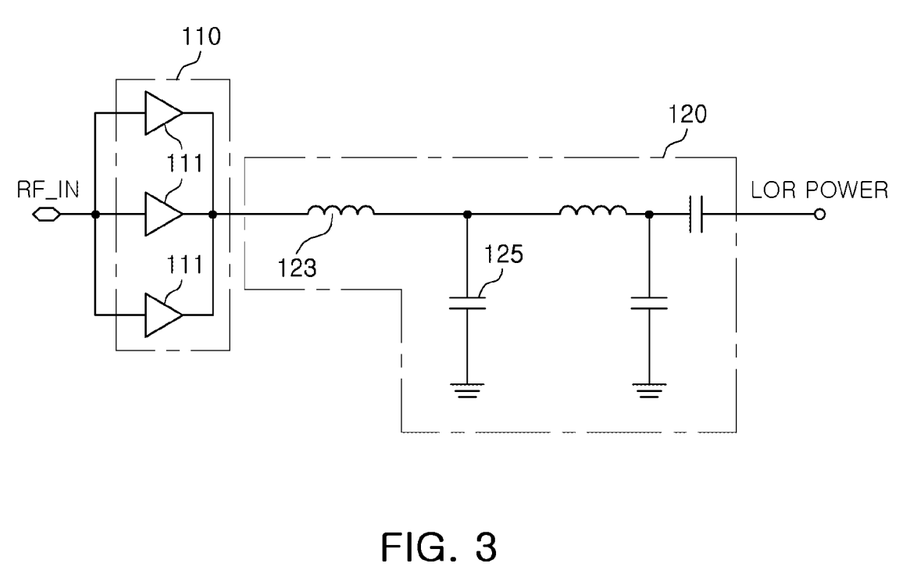
FIG. 3 illustrates a low power mode controlled configuration and operation of a power amplifier, according to one or more embodiments.

FIG. 3 illustrates a low power mode controlled configuration and operation of a power amplifier, such as the power amplifier of FIG. 2, according to one or more embodiments. Here, though FIG. 3 will be described with reference to the power amplifier of FIG. 1 and/or FIG. 2, embodiments are not limited thereto.

Referring to FIG. 3, the power amplifier 100 may output a signal having lower power than a preset level of power, so as to be operated in a low power mode.

In a case in which the level of power of the signal output by the amplifying unit 110 is lower than the preset level of power, the first switching unit 112 may be controlled to be changed to an off state. Thus, the amplifying transistors which are connected to the first switching unit 112 in series may be controlled to not perform an amplification operation.

In a case in which the level of power of the signal output by the amplifying unit 110 is lower than the preset level of power, the second switching unit 124 may be controlled to be changed to an on state. Thus, the inductance of the plurality of inductors 123 may be the sum of levels of inductance of the plurality of inductors 123 which are not connected in parallel to the second switching unit 124.

Similarly, in this case in which the level of power of the signal output by the amplifying unit 110 is lower than the preset level of power, the third switching unit 126 may be controlled to be changed to an off state. Thus, the capacitance of the plurality of capacitors 125 may be the sum of levels of capacitance of the plurality of capacitors 125 which are not connected to the third switching unit 126 in series.

Figure 4:
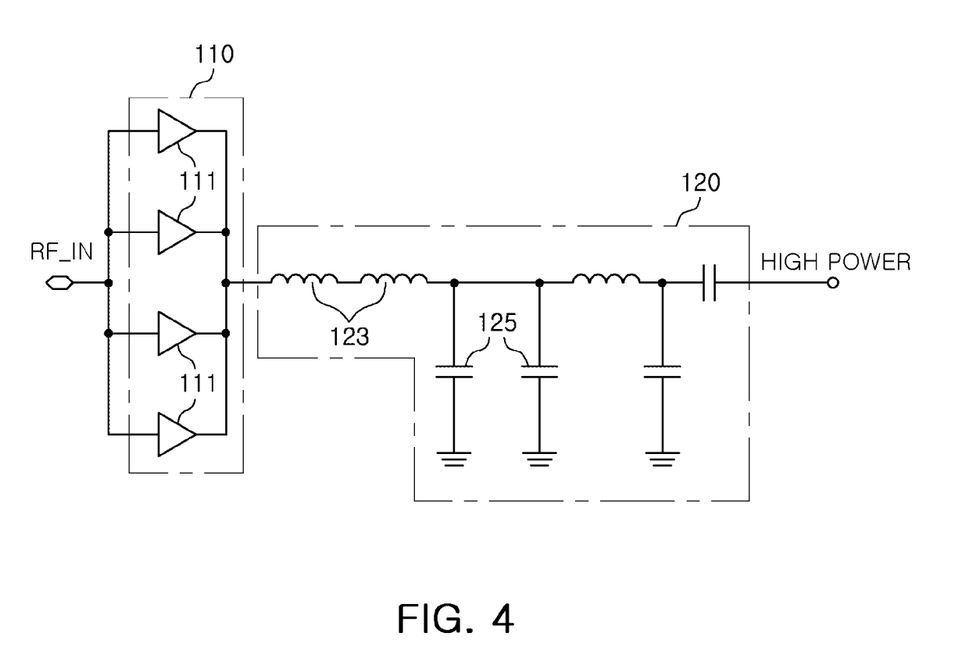
FIG. 4 is a view illustrating a high power mode controlled configuration and operation of a power amplifier, according to one or more embodiments.

FIG. 4 illustrates a high power mode controlled configuration and operation of a power amplifier, such as the power amplifier of FIG. 2, according to one or more embodiments. Here, though FIG. 4 will be described with reference to the power amplifier of FIG. 1 and/or FIG. 2, embodiments are not limited thereto.

Referring to FIG. 4, the power amplifier 100 may output a signal having higher power than a preset level of power, so as to be operated in a high power mode.

In a case in which the level of power of the signal output by the amplifying unit 110 is higher than the preset level of power, the second switching unit 112 may be controlled to be changed to an on state. Thus, the amplifying transistors which are connected to the first switching unit 112 in series may amplify the input signal and output the amplified signal.

In a case in which the level of power of the signal output by the amplifying unit 110 is higher than the preset level of power, the second switching unit 124 may be controlled to be changed to an off state. Thus, the inductance of the plurality of inductors 123 may be the sum of levels of inductance of the plurality of inductors 123.

Similarly, in this case in which the level of power of the signal output by the amplifying unit 110 is higher than the preset level of power, the third switching unit 126 may be controlled to be changed to an on state. Thus, the capacitance of the plurality of capacitors 125 may be the sum of levels of capacitance of the plurality of capacitors 125.

Figure 5:
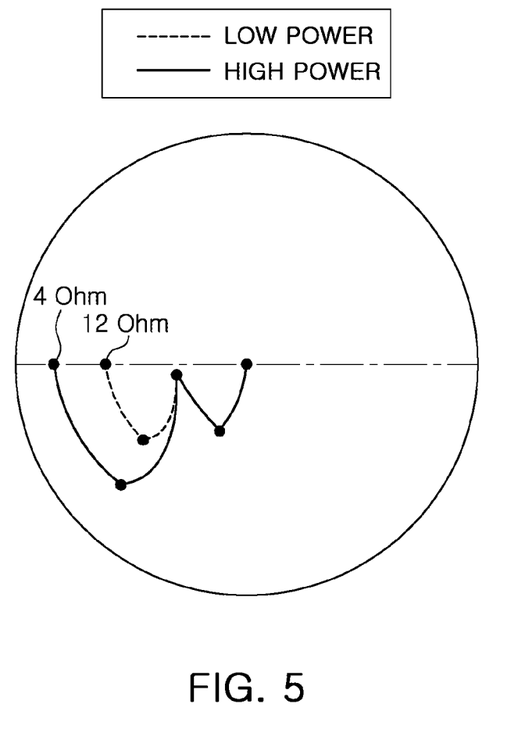
FIG. 5 illustrates impedance matching of a power amplifier, according to one or more embodiments.

FIG. 5 illustrates impedance matching of a power amplifier, according to one or more embodiments. Here, though FIG. 5 will be described with reference to the power amplifier of FIG. 1 and/or FIG. 2, embodiments are not limited thereto.

Referring to FIG. 5, the output impedance of the amplifying unit 110 may be controlled to be matched by a series of processes through the first impedance network and the second impedance network. For example, the impedance of the second impedance network may be controlled to be 4Ω or 12Ω depending on the level of power of the signal output by the amplifying unit.

Figure 6:
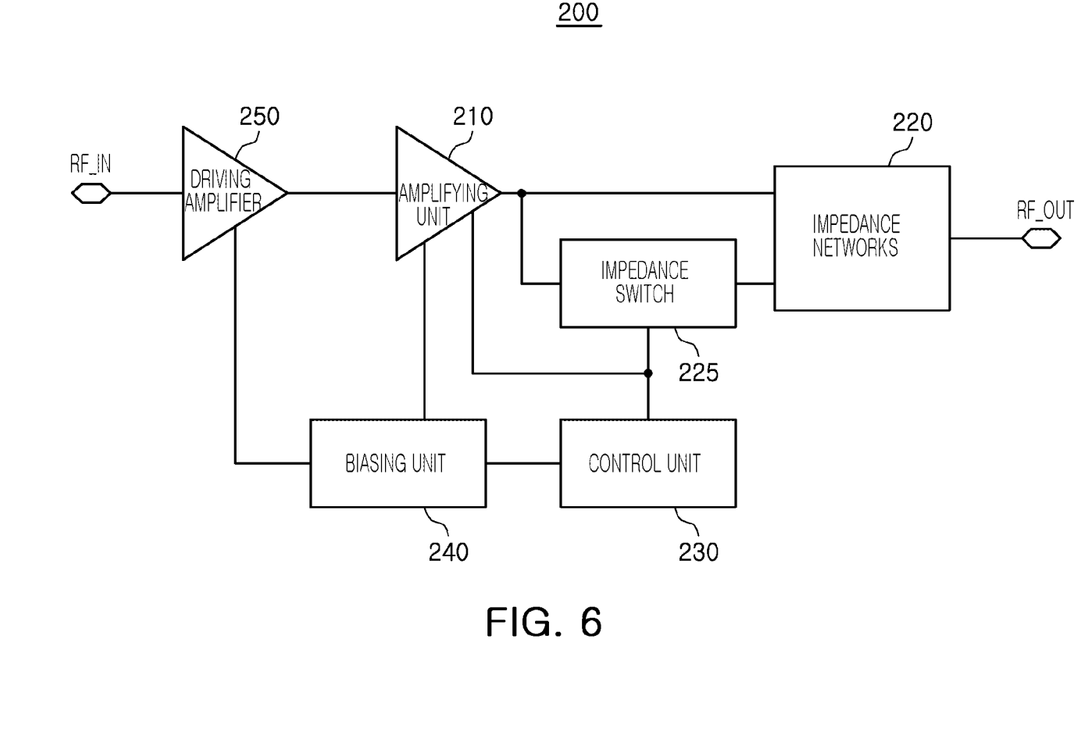
FIG. 6 illustrates a power amplifier, according to one or more embodiments.

FIG. 6 illustrates a power amplifier, according to one or more embodiments.

Referring to FIG. 6, a power amplifier 200 may include an amplifying unit 210, a plurality of impedance networks 220, an impedance switch 225, a control unit 230, a biasing unit 240, and a driving amplifier 250, for example. Here, except as described further below, descriptions of components of the power amplifier 200 may operate similarly as similar components discussed above with regard to any of the power amplifier descriptions above with reference to FIGS. 1 through 5, and thus repetition of such descriptions will be omitted here.

The amplifying unit 210 may amplify an input signal. For example, the amplifying unit 210 may receive a control signal and may output different power level signals according to the control signal.

The plurality of impedance networks 220 may be connected between the amplifying unit 210 and an output port RF_OUT to have respective preset impedances. For example, each of the plurality of impedance networks 220 may include an inductor and a capacitor.

The impedance switch 225 may be connected to at least one of the impedance networks of the plurality of impedance networks 220, so as selectively use the connected at least one impedance network of the impedance networks based on the impedance switch being turned on or off. Thus, as discussed above, the power amplifying unit 200 may similarly efficiently output signals having various levels of power according to a communications standard, as desired.

The control unit 230 may output a control signal based on the level of power of the signal output by the amplifying unit 210 to control the on-off state of the impedance switch 225. The control unit 230 may be configured to selectively generate any of the above described control signals, e.g., to selectively control the output power level, any bias voltages, and/or switched impedances, as only examples.

The biasing unit 240 may bias the amplifying unit 210. Here, biasing means that a predetermined level of current or voltage is provided to allow or control a bias current to flow in a particular block or element or to allow or control a bias voltage to be applied to a particular block or element. For example, the biasing unit 240 may provide a voltage or a current to the amplifying unit 210, based on control signal. Here, the control signal that controls the biasing unit 240 may be the same (or similarly controlled) as the control signal controlling the impedance switch 225. Thus, the power amplifying unit 200 may output signals having various levels of power in an optimal state.

The driving amplifier (DA) 250 may amplify a low signal to have a magnitude within an amplification range of the amplifying unit 210. For example, the driving amplifier 250 may be biased by the biasing unit 240. Here, the driving amplifier 250 may receive the voltage or the current determined based on a control signal, e.g., the same (or similarly controlled) as the control signal controlling the impedance switch 225 or the control signal controlling the biasing unit 240.

Specifically, in a case in which the power amplifier 200 is operated in a high power mode, the biasing unit 240 may be controlled to provide a voltage of 1.3V to an input terminal of the amplifying unit 210 or an input terminal of the driving amplifier 250. In addition, in a case in which the power amplifier 200 is operated in a low power mode, the biasing unit 240 may be controlled to provide a voltage of 1.33V to the input terminal of the amplifying unit 210 or the input terminal of the driving amplifier 250.

Figure 7:
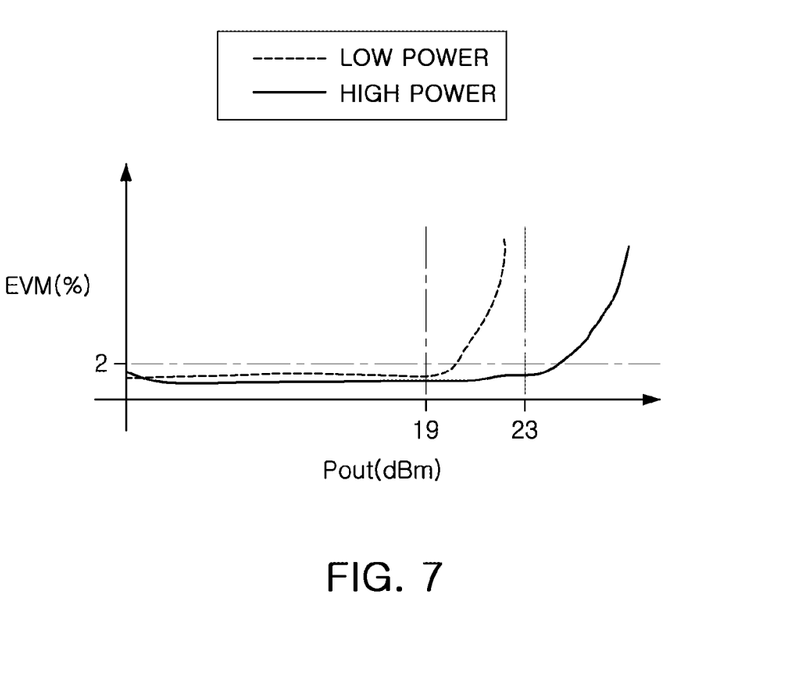
FIG. 7 illustrates error vector magnitude depending on output power of a power amplifier according to one or more embodiments.

FIG. 7 illustrates error vector magnitude (EVM) depending on output power of a power amplifier according to one or more embodiments, such as the power amplifier 200 of FIG. 6, as only an example.

For example, in the case in which the power amplifier is operated in a low power mode, an error vector magnitude may be 2% or less in a state in which output power Pout is 19 dBm.

In addition, in the case in which the power amplifier is operated in a high power mode, the error vector magnitude may be 2% or less in a state in which the output power Pout is 23 dBm.

That is, in an embodiment, the power amplifier may be controlled to output signals having various levels of power, such as various levels of power that abide by a particular communications standard.

Figure 8:
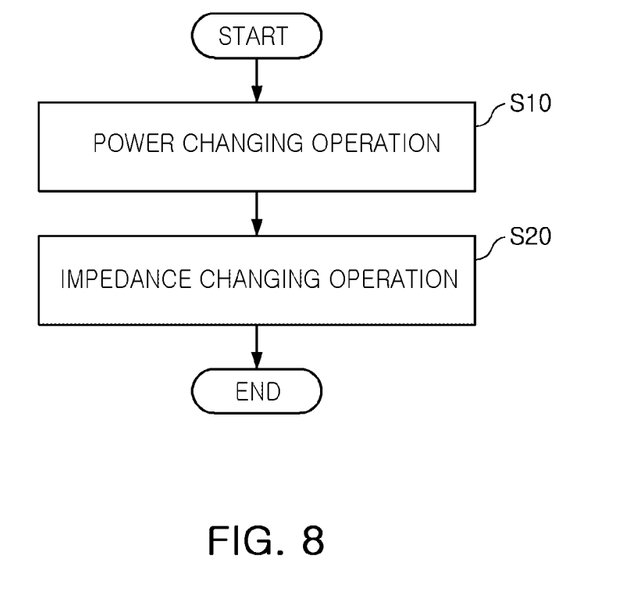
FIG. 8 illustrates a power amplifying method, according to one or more embodiments.

FIG. 8 illustrates a power amplifying method, according to one or more embodiments. Here, as only examples with regard to FIGS. 8 and 9, the power amplifying methods controlling an output of a power amplifier may be performed by any of the above described power amplifiers, and any of the above descriptions of the operations of such power amplifiers are also incorporated here. Accordingly, except for the following discussion, further corresponding descriptions of the above power amplifiers and corresponding operations are omitted below.

Referring to FIG. 8, the power amplifying method may include an amplifying transistor changing operation (S10) and an impedance changing operation (S20), for example.

As only an example, in an embodiment, the power amplifying method may be performed by an internal control circuit of a power amplifier and/or a control circuit external to the power amplifier.

In the amplifying transistor changing operation (S10), the power amplifier may be controlled to switch an on-off state of an example first switching unit, e.g., connected to at least one of a plurality of amplifying transistors of the power amplifier, to control a changing of levels of power of signals output by the plurality of amplifying transistors.

In the impedance changing operation (S20), the power amplifier may be controlled to switch an on-off state of an example impedance switch unit, e.g., connected to at least one of a plurality of impedance networks connected to the plurality of amplifying transistors, to control a changing of a total impedance of the plurality of impedance networks.

Figure 9:
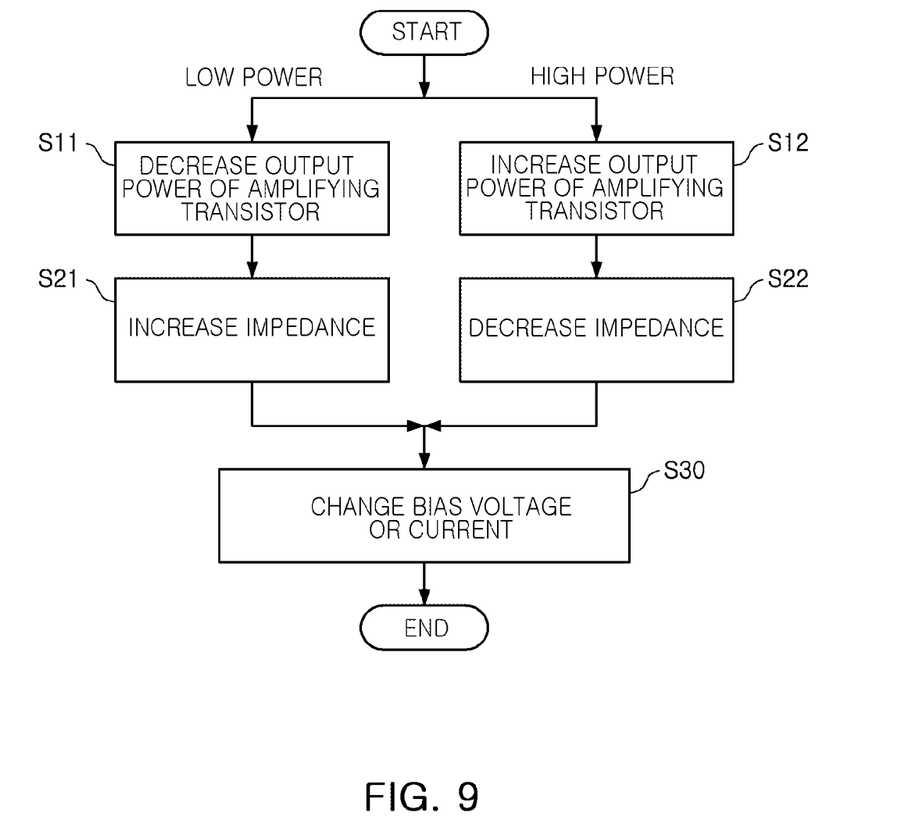
FIG. 9 illustrates a power amplifying method, according to one or more embodiments.

FIG. 9 illustrates a power amplifying method, according to one or more embodiments.

Referring to FIG. 9, in a case in which a power amplifier is controlled to be operated in a low power mode, the power amplifier may be controlled to decrease an output power level of a amplifying transistors of the power amplifier (S11) and increase an output impedance (S21). In addition, in a case in which the output power of the amplifying transistors is decreased by 4 dB, e.g., about 4 dB and only as an example, the output impedance may be increased by two to four times, e.g., about two to four times and only as an example.

Meanwhile, the power amplifying method may further include a biasing operation (S30) of biasing the plurality of amplifying transistors.

For example, in the biasing operation (S30), the power amplifier may be controlled to change a voltage or a current provided to the plurality of amplifying transistors when the level of power of the signals output by the amplifying transistors is changed or when the total impedance of the plurality of impedance networks is changed.

As set forth above, according to the one or more embodiments, a power amplifier may output signals having various levels of power, such as various levels of power conforming with a communications standard, unit cost and a size of the power amplifier may be reduced, and a degree of freedom of design may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is not limited by the detailed description, but further supported by the claims and their equivalents, and all variations within the scope of the claims and their equivalents are to be construed as being included in the disclosure.

What is claimed is:

1. A power amplifier comprising:
an amplifying unit configured to amplify an input signal;
an impedance varying unit connected between the amplifying unit and an output port that is for outputting an amplified signal of the input signal; and
a controller configured to output a first control signal based on a level of power of the amplified input signal of the amplifying unit to control a varying of impedance of the impedance varying unit,
wherein the impedance varying unit comprises:
a plurality of inductors connected to each other in series;
a plurality of capacitors connected to each other in parallel;
a first impedance switching unit connected in parallel with at least one of the plurality of inductors and to selectively, according to the first control signal and to vary the impedance of the impedance varying unit, disconnect the at least one inductor from one or more remaining inductors of the plurality of inductors that are provided the amplified input signal; and
a second impedance switching unit connected with respect to at least one capacitor of the plurality of capacitors and to selectively, according to the first the control signal and to vary the impedance of the impedance varying unit, disconnect the at least one capacitor from being connected in parallel with one or more remaining capacitors of the plurality of capacitors that are provided the amplified input signal.

2. The power amplifier of claim 1, wherein the controller outputs a second control signal to control the level of power, between plural available output power levels, for the amplifying of the input signal.

3. The power amplifier of claim 1, wherein the amplifying unit comprises:
a plurality of amplifying transistors connected to each other in parallel to amplify the input signal; and
a first switching unit connected between at least one of the plurality of amplifying transistors and the impedance varying unit to change a configuration of the plurality of amplifying transistors with respect to the impedance varying unit, to control the level of power for the amplifying of the input signal, according to the first control signal.

4. The power amplifier of claim 3, wherein the plurality of amplifying transistors comprises four amplifying transistors that are connected to each other in parallel,
the first switching unit is connected between one amplifying transistor of the four amplifying transistors and the impedance varying unit and selectively operates to disconnect the one amplifying transistor from the impedance varying unit, to control the level of power for the amplifying of the input signal, according to the first control signal, and
the impedance varying unit controls impedance of the impedance varying unit, based on the first switching unit, to selectively be a first impedance and a second impedance, wherein the second impedance is two to four times the impedance of the first impedance.

5. The power amplifier of claim 4, wherein the impedance varying unit controls the impedance of the impedance varying unit to be the second impedance in an off state and to be the first impedance in an on state.

6. The power amplifier of claim 1, wherein the impedance varying unit comprises:
an impedance network including the plurality of inductors and plurality of capacitors; and
another impedance network, having a set impedance, connected to the impedance network,
wherein the controller is configured to, as the level of power of the amplified input signal increases, control the first control signal so to implement a decrease in impedance of the impedance network.

7. The power amplifier of claim 1, wherein the controller is configured to, when the level of power of the amplified input signal decreases by 4 dB, control the first control signal so as to implement an increase in a total impedance of the impedance varying unit by two to four times.

8. A power amplifier comprising:
an amplifying unit configured to amplify an input signal;
a plurality of impedance networks, having preset respective impedances, selectively connected between the amplifying unit and an output port that is for outputting an amplified signal of the input signal;
an impedance switch connected to at least one of the plurality of impedance networks to change at least between a first positive number of the plurality of impedance networks and a second positive number of the plurality of impedance networks being selected to be connected between the amplifying unit and the output port; and
a controller configured to output a first control signal based on a level of power of the amplified input signal of the amplifying unit to control switching of the impedance switch.

9. The power amplifier of claim 8, wherein the amplifying unit comprises:
a plurality of amplifying transistors connected to each other in parallel to amplify the input signal; and
a first switching unit connected between at least one of the plurality of amplifying transistors and at least one of the plurality of impedance networks to disconnect the one amplifying transistor from the at least one impedance network, to control the level of power of the amplified input signal, according to the first control signal.

10. The power amplifier of claim 8, wherein each of the plurality of impedance networks comprises an inductor and a capacitor, and
the impedance switch comprises:
a first impedance switching unit connected in parallel with at least one of a plurality of inductors included in the plurality of impedance networks and to selectively, according to the first control signal, connect the at least one inductor with another inductor of the plurality of inductors; and
a second impedance switching unit connected between at least two of a plurality of capacitors included in the plurality of impedance networks and to selectively, according to the first control signal, connect the two capacitors.

11. The power amplifier of claim 10, wherein, when the level of power of the amplified input signal output by the amplifying unit meets or is set to meet a preset level of power, the first impedance switching unit is controlled to disconnect the at least one inductor with the other inductor, and the second impedance switching unit is controlled to connect the two capacitors when the level of power of the amplified input signal meets the preset level of power.

12. The power amplifier of claim 8, further comprising a biasing unit configured to bias the amplifying unit,
wherein the biasing unit is controlled to provide, to the amplifying unit, a biasing voltage or current determined based on the first control signal.

13. A power amplifying method, the method comprising:
amplifying, through an amplifier configuration having a plurality of amplifying transistors, an input signal based on an impedance seen by the amplifier configuration; and
varying the impedance seen by amplifier configuration based on a determined level of power of the amplified input signal,
wherein the amplifying includes controlling a connected configuration of the plurality of amplifying transistors in concert with the varying of the impedance seen by the amplifier configuration, and
wherein the varying of the impedance includes increasing at least one of an inductor produced inductance and a capacitor produced capacitance, based on the determined level of power.

14. The method of claim 13, wherein the plurality of amplifying transistors are arranged in parallel and the amplifying further comprises amplifying the input signal in at least a first connected configuration where the plurality of amplifying transistors are connected in parallel when amplifying the input signal and a second connected configuration where less than all of the plurality of amplifying transistors are connected in parallel when amplifying the input signal.

15. The method of claim 13, wherein the varying of the impedance includes increasing at least one of the inductor produced inductance and the capacitor produced capacitance based on whether the determined level of power of the signal output by the amplifying unit meets a preset level of power.

16. The method of claim 13, further comprising generating a control signal to control the varying of the impedance, including controlling the control signal so to implement a decrease in the impedance as the determined level of power of the amplified input signal increases.

17. The method of claim 13, further comprising generating a control signal to control the varying of the impedance, including controlling the control signal so as to implement an increase in the impedance by two to four times when the determined level of power of the amplified input signal decreases by 4 dB.

18. The power amplifier of claim 1, wherein the impedance varying unit includes plural impedance networks, including at least an impedance network used for impedance matching for different output power levels of the amplifying unit.

* * * * *